(12) United States Patent  
Chien et al.

(10) Patent No.: US 8,499,813 B2
(45) Date of Patent: Aug. 6, 2013

(54) SYSTEM FOR SEPARATING A DICED SEMICONDUCTOR DIE FROM A DIE ATTACH TAPE

(75) Inventors: Jack Chang Chien, Shanghai (CN); King Hoo Ong, Shanghai (CN); Weili Wang, Shanghai (CN); Li Wang, Shanghai (CN); XingZhi Liang, Shanghai (CN); Shicai Ma, Shanghai (CN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/398,647

(22) Filed: Feb. 16, 2012

(65) Prior Publication Data

US 2012/0145332 A1 Jun. 14, 2012

Related U.S. Application Data

(62) Division of application No. 12/709,952, filed on Feb. 22, 2010, now abandoned.

(51) Int. Cl.
 *B32B 38/10* (2006.01)
(52) U.S. Cl.
 USPC ........... 156/765; 156/707; 156/716; 156/758; 156/932; 156/943
(58) Field of Classification Search
 USPC .................. 156/707, 716, 758, 765, 932, 943
 See application file for complete search history.

(56) References Cited

U.S. PATENT DOCUMENTS

| | | | |
|---|---|---|---|
| 7,240,422 B2 * | 7/2007 | Cheung et al. | 29/762 |
| 7,265,035 B2 | 9/2007 | Honma et al. | |
| 7,470,120 B2 | 12/2008 | Cheung | |
| 2004/0065647 A1 | 4/2004 | Kubo et al. | |
| 2008/0157322 A1 | 7/2008 | Tang et al. | |

OTHER PUBLICATIONS

Office Action mailed Jun. 16, 2011 in U.S. Appl. No. 12/709,952.
Response to Office Action filed Sep. 16, 2011 in U.S. Appl. No. 12/709,952.
Notice of Non-Compliant Amendment mailed Dec. 16, 2011 in U.S. Appl. No. 12/709,952.

\* cited by examiner

*Primary Examiner* — Mark A Osele
*Assistant Examiner* — Nickolas Harm
(74) *Attorney, Agent, or Firm* — Vierra Magen Marcus LLP

(57) ABSTRACT

A system is disclosed for ejecting a semiconductor die from a tape to which the die is affixed during the wafer dicing process. In embodiments, the system includes an ejector tool including a support table, ejector pins and a pick-up arm. The support table is connected to a vacuum source for creating a negative pressure at an interface between the tape and support table. The support table further includes an aperture with one or more chamfered sidewalls. The vacuum source is connected to the aperture so that, upon placement of the tape on the support table with a die centered over the aperture, the vacuum source pulls a portion of the tape around the edges of the semiconductor die away from the die and into the space created by the chamfered edges.

20 Claims, 8 Drawing Sheets

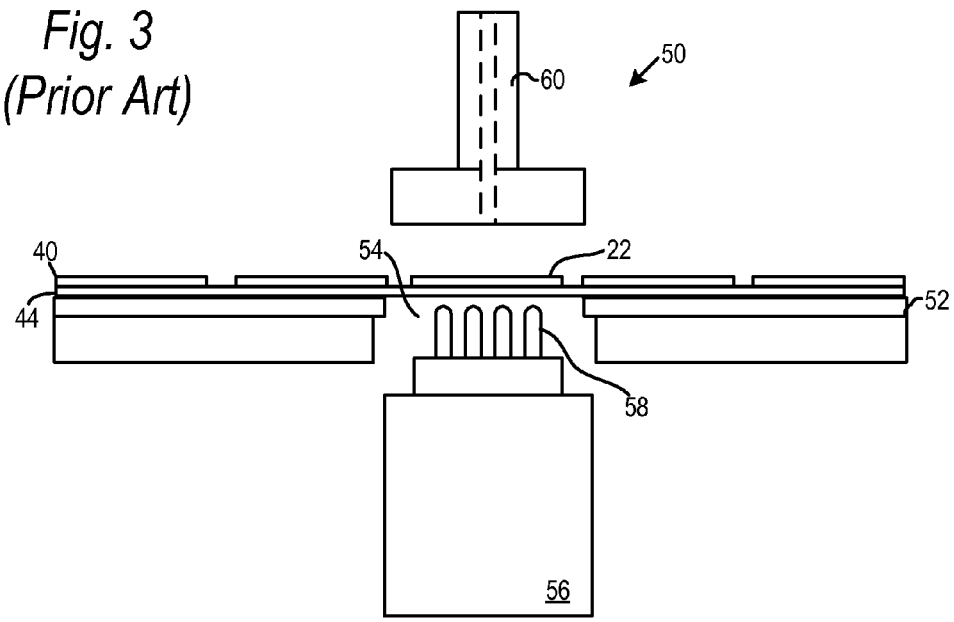
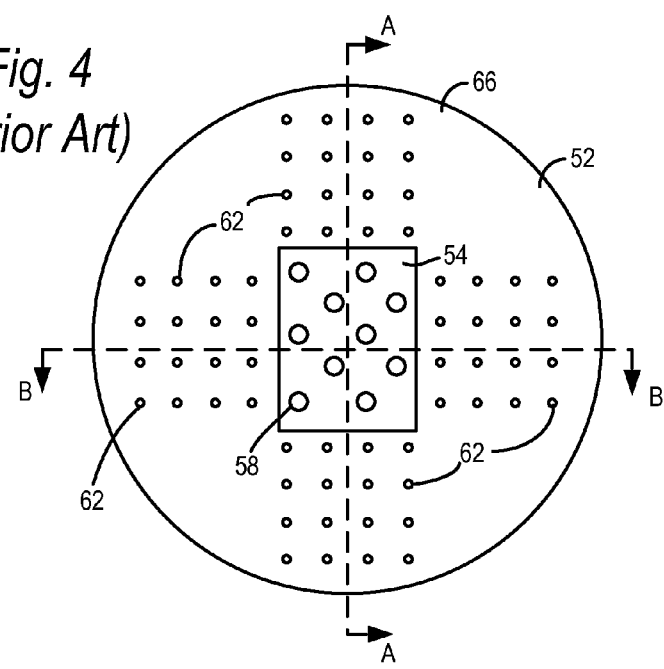
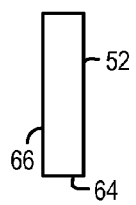
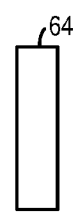
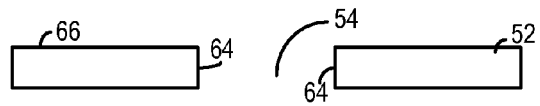

SYSTEM FOR SEPARATING A DICED SEMICONDUCTOR DIE FROM A DIE ATTACH TAPE

CLAIM OF PRIORITY

This application is a divisional of U.S. patent application Ser. No. 12/709,952 filed Feb. 22, 2010 entitled "SYSTEM FOR SEPARATING A DICED SEMICONDUCTOR DIE FROM A DIE ATTACH TAPE", which application claims priority to Chinese Patent Application No. 200910179844.6 filed Oct. 12, 2009 entitled "SYSTEM FOR SEPARATING A DICED SEMICONDUCTOR DIE FROM A DIE ATTACH TAPE", which applications are incorporated herein by reference in their entirety.

BACKGROUND

1. Field

Embodiments relate to a system for separating a diced semiconductor die from a die attach tape.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a so-called three-dimensional stacked configuration. An edge view of a conventional semiconductor package 20 (without molding compound) is shown in prior art FIG. 1. Typical packages include a plurality of semiconductor die 22, 24 mounted to a substrate 26. Although not shown in FIG. 1, the semiconductor die are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are soldered between the die bond pads of the semiconductor die 22, 24 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

In order to form a semiconductor package, a die bonding process is performed where a semiconductor die is diced from a wafer, picked up from an adhesive tape and bonded to a substrate. Prior art FIG. 2 shows a wafer 40 including a plurality of semiconductor die, for example die 22 (only some of which are numbered in FIG. 2). Each semiconductor die 22 on wafer 40 has been processed to include an integrated circuit as is known in the art capable of performing a specified electronic function. After testing the die 22 for bad die, the wafer may be placed on an adhesive film, referred to as a die attach film (DAF) tape, and then diced for example by saw or laser. The dicing process separates the wafer into individual semiconductor die 22, which remain affixed to the DAF tape. FIG. 2 shows wafer 40 affixed to a DAF tape 44.

In order to detach the individual die, the wafer and DAF tape are situated in a process tool, portions of which are shown in prior art FIG. 3. FIG. 3 shows a die ejector tool 50 including a vacuum chuck 52 on which is supported the wafer 40 and DAF tape 44. Chuck 52 includes a central aperture 54 over which a die 22 to be ejected is positioned. Tool 50 further includes ejector pin assembly 56 for actuating a number of ejector pins 58 up through aperture 54 and into contact with the back side of DAF tape 44. As explained below, the pins 58 push the die 22 upward so that it detaches from the DAF tape. The DAF tape may be formed of a die attach film adhered to a tape, and upon separation of the die from the tape, the film may remain affixed to a bottom surface of the die. A pick-up arm 60 is further provided to grip and complete the detachment of the die 22. The pick-up tool then transports the die 22 for attachment to the substrate or transport elsewhere.

Various chuck and pin assemblies have been implemented in the prior art to detach a die from an adhesive tape. One such configuration is shown in prior art FIG. 4, which shows a top view of vacuum chuck 52. Vacuum chuck 52 includes a plurality of openings 62 (only some of which are numbered in FIG. 4). The openings 62 are connected to a negative pressure to communicate a vacuum to the upper surface of chuck 52 in order to hold the DAF tape 44 firmly on the chuck 52. The top view of FIG. 4 also shows the aperture 54, through which the ejector pins 58 are visible. Prior art FIG. 5 is a cross-sectional view through line A-A of FIG. 4, and prior art FIG. 6 is a cross-sectional view through line B-B of FIG. 4. FIGS. 5 and 6 are provided to show that, in conventional die ejector tools, the aperture 54 is defined by perpendicular edges. That is, the sidewalls 64 of aperture 54 are perpendicular to an upper surface 66 of vacuum chuck 52.

Prior art FIGS. 7-9 illustrate the process by which semiconductor die 22 are detached from the DAF tape 44 in the tool 50. The chuck translates until a given die 22 is positioned over aperture 54. The pin assembly 56 then actuates the ejector pins 58 upward so that the pins push the tape 44 and die 22 upward. The footprint of the pins on the backside of the tape is less than the length and width of the semiconductor die, so that as the pins push the tape and die upward, the die and film delaminate from the tape. When the die 22 is mostly detached from the tape 44, the pick-up arm 60 can grab the die, for example by a vacuum at its surface, and carry the die away.

The ejector pins 58 may all rise up in concert. Alternatively, it is known to provide a multi-stage ejection, such as for example illustrated in U.S. Pat. No. 4,850,780 entitled "Pre-Peel Die Ejector Apparatus." As shown in that patent, the chuck may include a telescopic ejector so that an outer ejector pushes the DAF tape and die upward to begin the detachment process. Next, the outer ejector remains stationary while an inner ejector, located radially inward from the outer ejector, continues upward to further separate the die from the DAF tape.

While the above-described ejector methods worked well enough in the past, die thickness have now decreased to 100 µm and thinner. At these thicknesses, the opposing forces exerted on the die by the above-described processes can break the die. For example, as shown in prior art FIG. 8, as the die 22 is pushed upward, the adhesive force of the DAF tape 44 exerts a downward force on the edge of the die. For thin die, these opposing forces may be sufficient to cause an edge 22a of the die 22 to crack or break as shown. Additionally or alternatively, as shown in prior art FIG. 9, opposing forces are similarly exerted on a semiconductor die adjacent to the die being ejected. The tape 44 under the adjacent die is held on the vacuum chuck 52, while the tape being pushed up exerts an upward force on the edge of the adjacent die. For thin die, these opposing forces may be sufficient to cause an edge 22*a* of the adjacent die 22 to crack or break as shown.

DESCRIPTION OF THE DRAWINGS

FIG. 3 is a prior art side view of a conventional ejector tool for separating the semiconductor die on a wafer from the DAF tape.

FIG. 4 is a prior art top view of a conventional vacuum chuck in the ejector tool of FIG. 3.

FIG. 5 is a cross-sectional view through line A-A of FIG. 4.

FIG. 6 is a cross-sectional view through line B-B of FIG. 4.

DETAILED DESCRIPTION

Embodiments will now be described with reference to FIGS. 10 through 18, which relate to a system and method of separating a semiconductor die from an adhesive tape, and a semiconductor package formed with such separated die. It is understood that the present semiconductor device may be embodied in many different forms and should not be construed as being limited to the embodiments set forth herein. The terms "top" and "bottom" and "upper" and "lower," and derivations of these terms are used herein for convenience and illustrative purposes only, and are not meant to limit the description of the semiconductor device inasmuch as the referenced item can be exchanged in position.

In general, embodiments relate to an ejector tool for ejecting a semiconductor die from an adhesive tape. Embodiments relate in particular to the configuration of an aperture in a support table of an ejector tool on which the adhesive tape and wafer are supported. While a particular support table is described hereinafter, it is understood that the aperture of the present system may be used in a wide variety of chucks, tables, collets and other support tables used in ejector tools. Similarly, while a particular adhesive tape is described hereinafter, it is understood that any tape used to hold a diced semiconductor wafer together in an ejector tool may be used.

Figure 1:
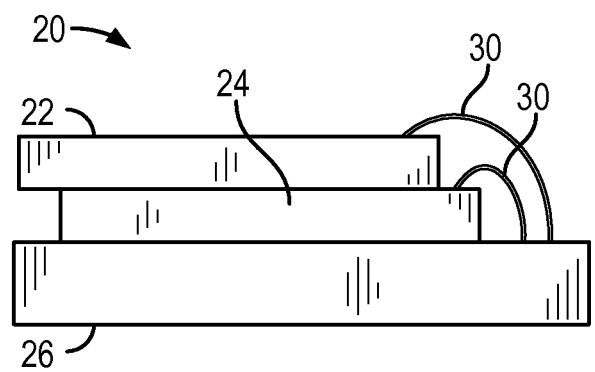
FIG. 1 is a prior art end view of a conventional semiconductor device.
Figure 2:
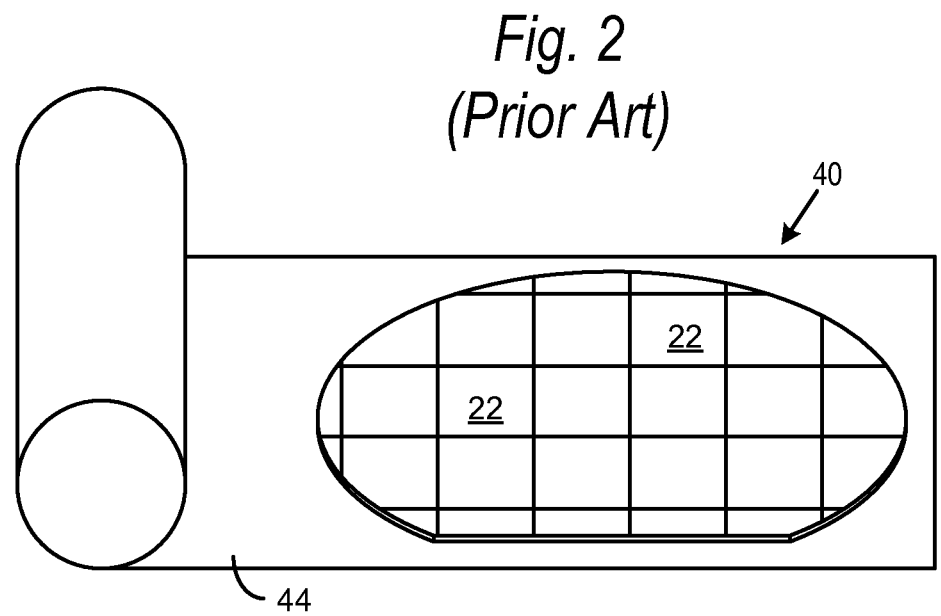
FIG. 2 is a prior art view of a semiconductor wafer mounted on a DAF tape.
Figure 7:
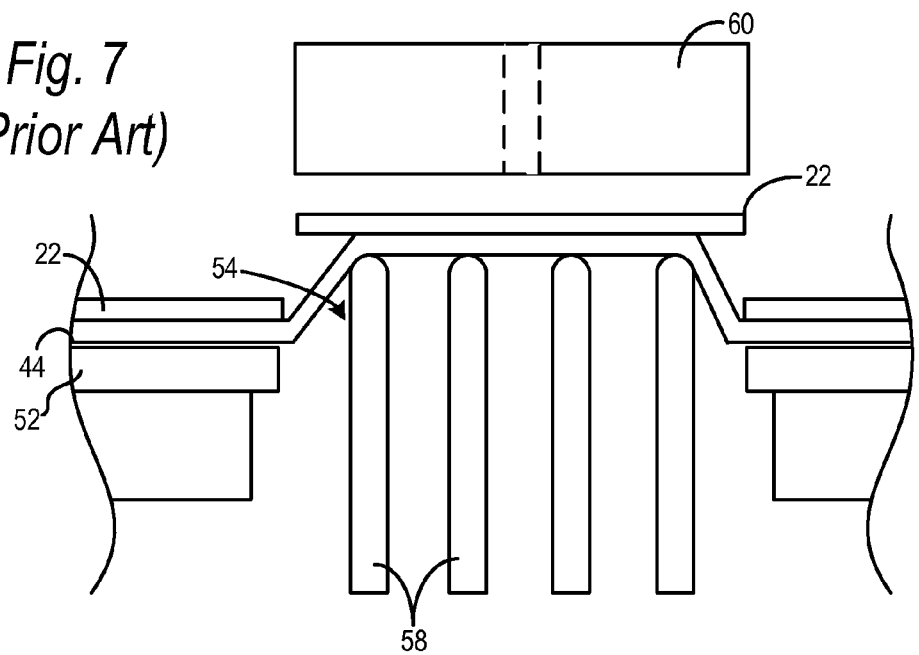
FIG. 7 is an enlarged prior art view showing a semiconductor die being separated from the DAF tape by a conventional ejector tool.
Figure 8:
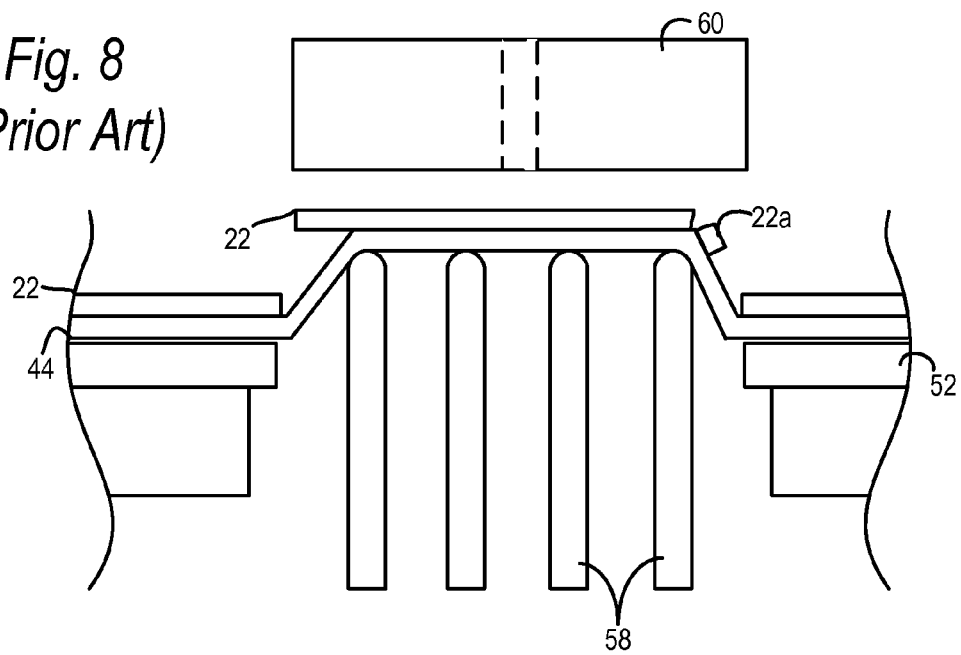
FIG. 8 is an enlarged prior art view showing an edge of a semiconductor die fracturing off while being separated from the DAF tape by a conventional ejector tool.
Figure 9:
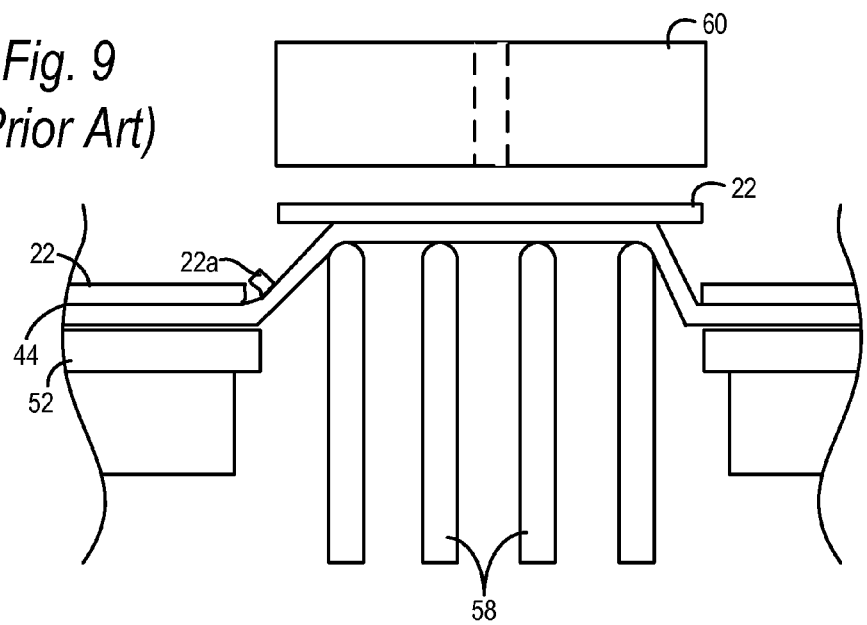
FIG. 9 is an enlarged prior art view showing an edge of an adjacent semiconductor die fracturing off while a semiconductor die is being separated from the DAF tape by a conventional ejector tool.
Figure 10:
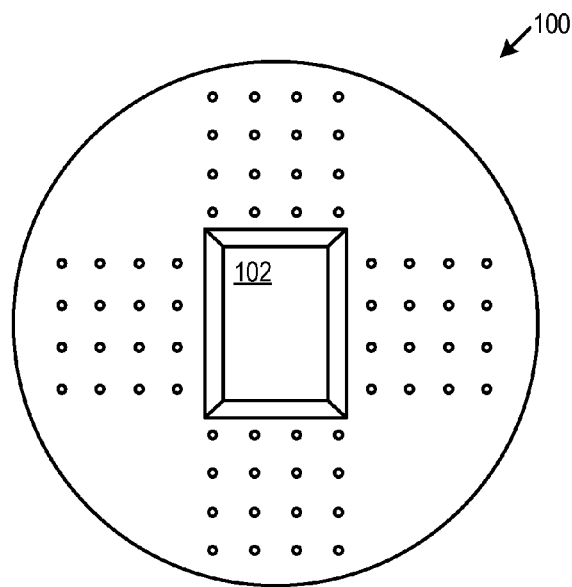
FIG. 10 is a top view of a support table of an ejector tool according to an embodiment of the present system.
Figure 11:
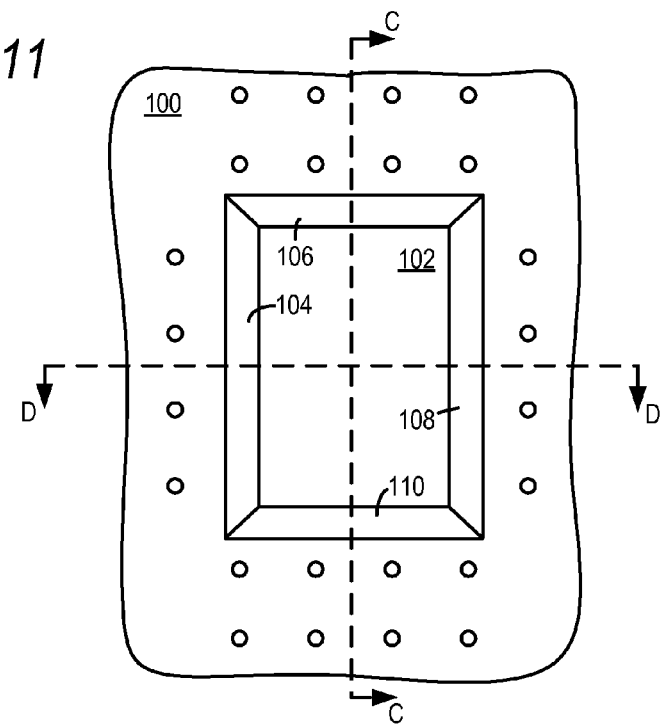
FIG. 11 is a top view of a portion of the support table shown in FIG. 10.
Figure 12:
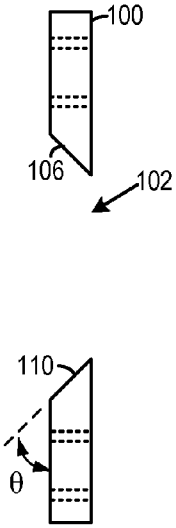
FIG. 12 is a cross-sectional view through line C-C of FIG. 11.
Figure 13:
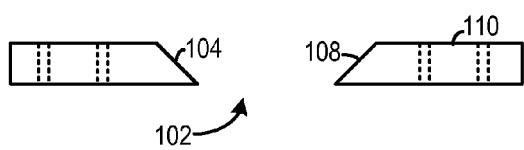
FIG. 13 is a cross-sectional view through line D-D of FIG. 11.
Figure 14:
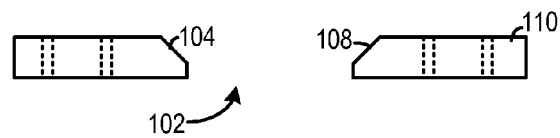
FIG. 14 is a cross-sectional view through line D-D of FIG. 11 showing an alternative embodiment of the present system.

FIG. 10 is a top view of a support table 100 according to an embodiment of the present system. The support table 100 may be a vacuum chuck of an ejector tool as described in the Background section, with the exception that the support table 100 includes an aperture 102 having chamfered edges as described below. FIG. 11 is a portion of the support table 100 shown in FIG. 10, and FIGS. 12 and 13 are cross sections through lines C-C and D-D in FIG. 11. As shown, support table 100 includes an aperture 102 defined by chamfered edges 104-110. Support table 100 may include an upper surface 112 for supporting a tape and wafer as explained below. In the area of support table 100 surrounding aperture 102, the support table may have a thickness of between 0.2 mm and 0.6 mm and more particularly 0.4, though the thickness of the support table around the aperture may vary outside of this range in further embodiments.

In embodiments, the aperture 102 may be a rectangle having the same aspect ratio of the semiconductor die 122. It is understood that the shape of the aperture need not be a rectangle and that the aspect ratio of the length to width may be different than the aspect ratio of the semiconductor die 122. While the aperture is shown as a completely open hole in FIGS. 10 and 11, it is understood that the aperture 102 may be partially filled with material, with the provision that the material have openings that allow the ejector pins 130 (described below) to extend up through the aperture into contact with the tape 124, and with the provision that any such material in the aperture not prevent the tape 124 from being sucked away from one or more edges of a semiconductor die around the chamfered edge(s) as described below.

In embodiments, each chamfer 104-110 may form an angle, θ, with the upper surface 112 between 10° and 60°, and in further embodiments, between 30° and 45°. These angle ranges are by way of example and the angles formed with upper surface 112 may vary outside of these ranges in further embodiments. The respective edges 104-110 may each be chamfered at the same angle, but one or more of the edges 104-110 may be chamfered at different angles in further embodiments. It is further contemplated that one, two or three of the edges around the aperture may have no chamfer, so as to form a right angle with the upper surface 112. Moreover, the chamfer may extend along the entire edge (i.e., between the upper surface 112 and an opposite surface) as shown. However, in an alternative embodiment shown in FIG. 14, one or more of the edges may include only a partial chamfer (edges 104 and/or 108 in the example of FIG. 14). The chamfer in this embodiment would be from the upper surface partially down to the opposite surface as shown.

Figure 15:
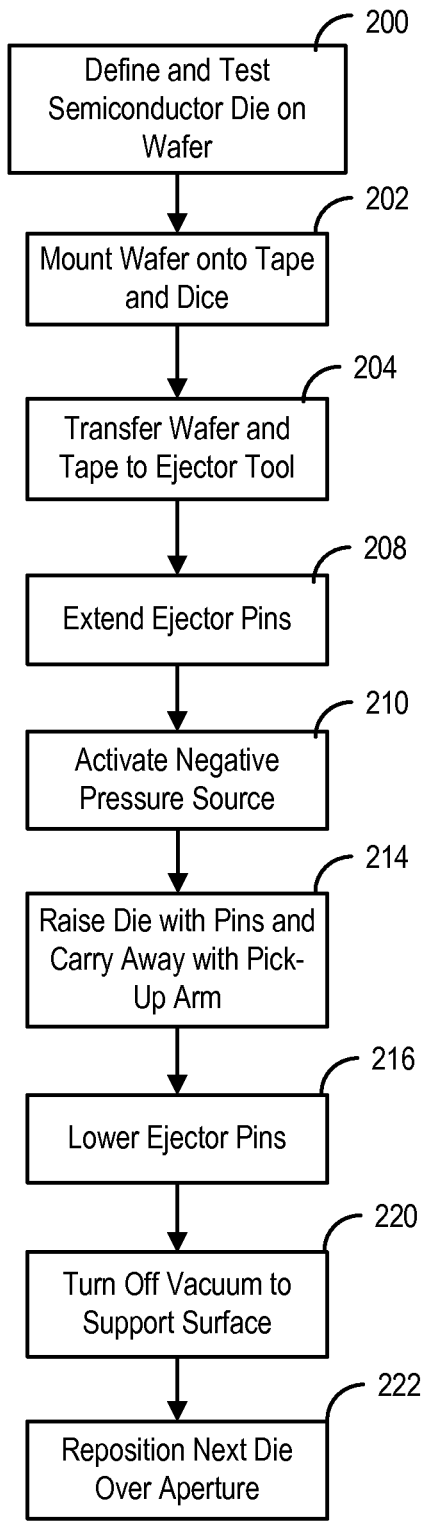
FIG. 15 is a flowchart for separating a semiconductor die from a DAF tape according to an embodiment of the present system.

The operation of an embodiment of the present system will now be described with reference to the flowchart of FIG. 15 and the side views of FIGS. 16 and 17. Semiconductor die are formed on a wafer and tested in step 200. The wafer is then mounted on an adhesive tape, such as a DAF tape of known design, and then diced into the individual semiconductor die in step 202. In one example, the die 122 may be diced from wafer 120 so as to have a length of 12.96 mm, a width 9.28 mm and a thickness of 56 μm. It is understood that these dimensions are by way of example only and may vary in alternative embodiments.

The DAF tape may be of a known construction and may contain a tape layer formed for example of polyester or the like laminated with an adhesive die attach film. One example of a DAF tape which may be used is EM-310VJ-P WEF, from Nitto Denko, Corporation, having headquarters in Osaka, Japan. Various known dicing techniques, such as for example sawing or laser cutting, may be used to cut the wafer into individual semiconductor die after the wafer is affixed to the DAF tape. Typical dicing processes leave a small kerf between adjacent die once mounted on the tape.

The tape and wafer are then transferred to an ejector tool in step 204 to remove the individual die. The ejector tool may be similar to the ejector tool described in the Background section, or similar to any other known tool for removing diced semiconductor die from an adhesive tape, with the exception that the tool includes a support table 100 having a chamfered aperture as described above. FIG. 16 shows a side view of a wafer 120 including a plurality of semiconductor die 122 attached to an adhesive tape 124. The tape 124 includes a base layer 124a and a die attach film layer 124b. The die 122 and tape 124 are positioned on support table 100 with the base layer 124a lying against upper surface 112 of support table 100. Although not shown, the ejector tool may further include a pick-up arm, as described above or as is known in the art, for completing the detachment of the semiconductor die 122 from the tape 124 and carrying the semiconductor die away as explained below.

As indicated, support table 100 may be a vacuum chuck including openings 128 connected to a vacuum source 126 to hold the tape 124 securely to the upper surface 112. The number and configuration of openings for creating the negative pressure at the upper surface 112 may vary in different embodiments. The tool may further include an ejector pin assembly including a plurality of ejector pins 130. The ejector pins may be any known type of ejector pins which may extend all together or in multiple stages. Telescopic type ejectors which extend in different stages may alternatively be used. The pins 130 may be initially retracted, and then they may be moved by the ejector pin assembly into engagement (or near engagement) with a back side of base layer 124a in step 208 after the tape 124 and wafer 120 are supported on the support table 100.

The length and width of aperture 102 at the top surface 112 is sized so as to be greater than the length and width of the die 122 centered over the aperture 102. In one embodiment where die 122 are sized as indicated above, the length and width of the aperture at the top surface 112 may be 13.31 mm and 9.63 mm, respectively. These numbers are by way of example only and may vary, proportionately or disproportionately with each other and/or the semiconductor die 122, in alternative embodiments. In embodiments, the length and width of the aperture 102 at the top surface 112 may be provided to be greater than the length and width of the semiconductor die 122 centered over the aperture 102. The boundaries of the aperture 102 at upper surface 112 may underlie the semiconductor die above, below, to the left and/or to the right of the die centered over the aperture 102. In further embodiments, the length and width of the aperture 102 may be provided to underlie the kerf gap between the center die and die adjacent thereto.

In one embodiment where die 122 are sized as indicated above, the length and width of the aperture at the bottom surface of table 100 (opposite surface 112) may be 12.51 mm and 8.83 mm, respectively. These numbers are by way of example only and may vary, proportionately or disproportionately with each other and/or the semiconductor die 122, in alternative embodiments. In embodiments, the length and width of the aperture 102 at the bottom surface may be provided to be less than the length and width of the semiconductor die 122 centered over the aperture 102. In embodiments, the thickness of support table 100 may be 0.4 mm, though the table 100 may be thicker or thinner than that in further embodiments.

In step 210, the negative pressure source below the support table 100 is activated so that a negative pressure is created within the openings 128 to secure the tape 124 to the support table 100. In accordance with the present system, the negative pressure is also communicated to aperture 102 to create a low pressure area within the aperture 102. The low pressure area within the aperture 102 is controlled relative to the pressure above the tape and wafer so that a force is exerted on the base layer 124a which exceeds the force (peeling strength) between the base layer 124a and die attach film 124b, but is less than the peeling strength between the die attach film 124b and the back side of semiconductor 120. The result is that the base layer 124a is pulled away from the adhesive film 124b in the area of the chamfered edges 104-110. As shown in FIG. 17, the base layer 124a is pulled into the space created by the chamfered edges 104-110. The film 124b remains on the die 122.

In one embodiment with dimensions as set forth above, the vacuum may create a sucking force along the length side of the base layer 124a of 0.32N. The peeling strength between the base layer 124a and the film 124b along the length dimension of the tape 124 may be 0.033N. And the peeling strength between the film 124b and the semiconductor die 122 along the length of the tape 124 may be 12.25N. Thus, with these respective forces, once the vacuum source in support table 100 is activated, the base layer 124a will pull away from the die attach film 124b, which remains on the back side of the die 122. It is understood that the forces discussed above may vary in alternative embodiments, provided the vacuum force is at least as great as is necessary to pull the base layer 124a away from the film 124b, or to pull both the base layer 124a and film 124b away from the back of the semiconductor die 122.

In the embodiments described above, the tape 124 includes two layers. In a further embodiment, the tape 124 may be a single layer capable of adhering directly to the semiconductor die 122. In such an embodiment, the vacuum force of the support table would exceed the peeling strength of the tape against the die so that the tape would pull away from the die around the chamfered edges as described above upon activation of the vacuum source 126.

Figure 16:
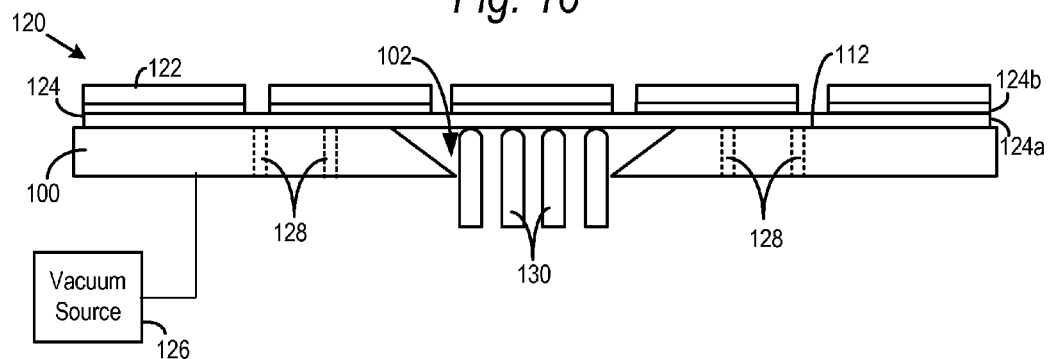
FIG. 16 is a side view of a wafer and a DAF tape situated on an ejector tool according to an embodiment of the present system.
Figure 17:
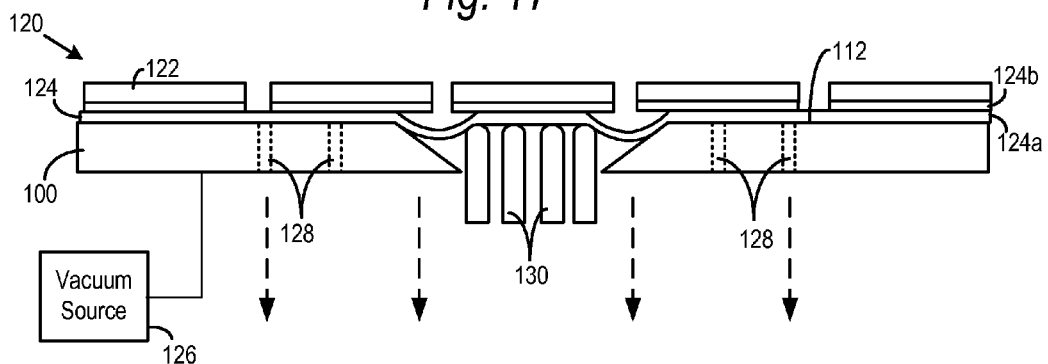
FIG. 17 is a side view of a semiconductor die being separated from a DAF tape by an ejector tool according to an embodiment of the present system.

Referring again to the embodiment of FIGS. 16 and 17, given the dimensions of the chamfer relative to that of the semiconductor die 122 centered over aperture 102, pulling the base layer 124a away from the film 124b around the chamfer pulls the base layer away from the edges of the centered semiconductor die. Thus, the base layer is effectively pulled away from the edges of the centered semiconductor die 122 to be ejected without the pins exerting an upward mechanical force on the lower surface of the semiconductor die. Thereafter, the pins 130 may raise the centered semiconductor die 122 in step 214. Either at this point, or at any time after the die are positioned on the support table 100, the pick-up arm may descend into contact with an upper surface of the semiconductor die to be ejected. Once the pins have raised the semiconductor die, the pick-up arm may grip the centered semiconductor die 122. Once the ejector pins have reached their upper extent, the die 122 is held by the pick-up arm while supported only on the tips of the ejector pins 130. In this position, the die 122 is substantially separated from the tape 124. The pick-up arm may then lift upward to finish the detachment of the semiconductor die and carry the die to the next processing station.

After the die 122 is completely detached from the dicing tape 124, the ejector pins 130 lower back beneath the support table 100 (step 216), and the vacuum suction applied to the vacuum openings 128 is turned off (step 220). The tape 124 may then be repositioned in step 222 to move the next die over the aperture 102 so that the process may be repeated.

Using this method of initially pulling the tape away from the semiconductor die edges prior to raising the die, the danger of cracking or breaking of the die edges is greatly reduced. In actual production experiments, yield was increased 1% to 3% using the above-described method. It is also contemplated that the tape 124 may be pulled away from the edge of one or more die adjacent to the die being ejected using the above-described method as shown in FIG. 17. However, the tape need not be pulled away from a die until it is centered over the chamfered aperture 102 in embodiments.

Figure 18:
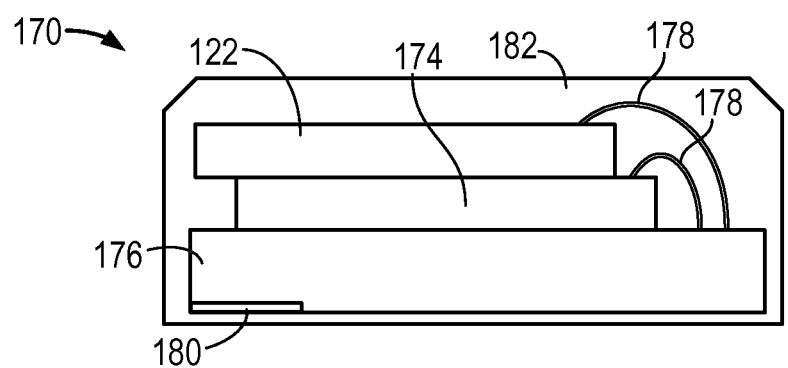
FIG. 18 is a side view of a finished semiconductor package including semiconductor die formed by a method of the present system.

FIG. 18 illustrates a semiconductor package 170 assembled using semiconductor die ejected by the above-described method. The semiconductor package 170 includes a plurality of semiconductor die including one or more die 122. These die may be for example non-volatile memory coupled with a controller die 174 such as for example an ASIC. Other types of die are contemplated. The die are electrically coupled to a substrate 176, for example via wire bonds 178. Passive components (not shown) may further be mounted on the substrate 176. The package 170 may for example be a land grid array (LGA) package which may be removably inserted into and removed from a host device. In such an embodiment, the substrate may include contact fingers 180 on a lower surface of the package for mating with terminals in the host device. The package may be encapsulated in a molding compound 182 to protect the semiconductor die and other components against shock and moisture.

In general, the present technology may relate to a tool for separating a semiconductor die from at least one layer of a tape having first and second layers. The first and second layers are held together with a certain peeling strength. The tool includes a support table having an upper surface for supporting the tape and semiconductor die. The support table further includes an aperture in the upper surface having at least one chamfered sidewall provided so that a distance between the at least one chamfered sidewall and a wall opposite the at least one chamfered sidewall is greater at the upper surface of the support table as compared to a same dimension at a lower surface of the support table opposite the upper surface. The tool further includes a vacuum source for holding the first layer of the tape to the support table. The vacuum source is communicated to the aperture and exerts a force on the first layer of the tape that exceeds the peeling strength holding first and second layers of the tape together. This results in the first layer of the tape being pulled away from the second layer and into the space created by the chamfer.

The present technology also relates to a method of separating a semiconductor die from at least one layer of a tape having first and second layers, where the first and second layers are held together with a given peeling strength. The method includes a first step of situating the tape and semiconductor die on a support table with a reference semiconductor die to be separated centered over an aperture including at least one chamfered sidewall. The method further includes a second step of generating a suction force at an interface between an upper surface of the support table and the first layer of tape supported on the support table, the suction force exceeding the peeling strength to pull the first layer of tape away from at least one edge of the reference semiconductor die positioned over the at least one chamfered sidewall.

The present technology further relates to a semiconductor package including a substrate and at least one semiconductor die, where the at least one semiconductor die is separated from a wafer by a particular method. This method includes a first step of mounting the at least one semiconductor die on a tape along with the other semiconductor die on the wafer. The tape includes first and second layers affixed to each other with a certain peeling strength. The method includes a second step of dicing the at least one semiconductor die from the other semiconductor die. The method further includes a third step of situating the tape and at least one semiconductor die of the wafer on a support table with the at least one semiconductor die centered over an aperture including at least one chamfered sidewall. And the method includes a fourth step of generating a suction force at an interface between an upper surface of the support table and the first layer of tape supported on the support table. The suction force generated in the fourth step exceeds the peeling strength between the first and second layers to pull the first layer of tape away from at least one edge of the at least one semiconductor die positioned over the at least one chamfered sidewall.

The foregoing detailed description has been presented for purposes of illustration and description. It is not intended to be exhaustive or to limit the description to the precise form disclosed. Many modifications and variations are possible in light of the above teaching. The described embodiments were chosen in order to best explain the principles of the claimed system and its practical application to thereby enable others skilled in the art to best utilize the claimed system in various embodiments and with various modifications as are suited to the particular use contemplated. It is intended that the scope of the method be defined by the claims appended hereto.

We claim:

1. A tool for separating a semiconductor die from at least one layer of a tape having first and second layers, the first and second layers held together with a peeling strength, the tool comprising:
    a plurality of ejector pins;
    a support table including an upper surface for supporting the tape and semiconductor die, the support table further including an aperture in the upper surface through which aperture the plurality of ejector pins extend, the aperture having at least one chamfered sidewall, the at least one chamfered sidewall provided so that a distance between the at least one chamfered sidewall and a wall opposite the at least one chamfered sidewall is greater at the upper surface of the support table as compared to a same dimension at a lower surface of the support table opposite the upper surface; and
    a vacuum source for holding the first layer of the tape to the support table, the vacuum source being communicated to the aperture and exerting a force on the first layer of the tape exceeding the peeling strength.

2. The tool recited in claim 1, the aperture being rectangular and including four chamfered sidewalls.

3. The tool recited in claim 1, the aperture being rectangular and including two chamfered sidewalls opposite each other.

4. The tool recited in claim 1, the at least one chamfered sidewall having a sidewall sloped at an angle of between 10° and 60° relative to the upper surface of the support table.

5. The tool recited in claim 1, the at least one chamfered sidewall defining a space into which the first layer may be sucked away from at least one edge of the semiconductor die.

6. The tool recited in claim 1, further comprising at least one ejector for extending through the aperture from the lower surface of the support table, the ejector capable of lifting the semiconductor die upward after the first layer has been sucked away from at least one edge of the semiconductor die.

7. The tool recited in claim 1, wherein the aperture is rectangular and sized to have a length and width at the upper surface that is greater than a length and width of the semiconductor die, and wherein the aperture is sized to have a length and width at the lower surface that is less than the length and width of the semiconductor die.

8. The tool recited in claim 7, wherein the first layer of the tape is sucked away from at least one edge of the semiconductor die and against the at least one chamfered sidewall upon activation of the vacuum source.

9. A tool for separating a semiconductor die from at least one layer of a tape, the tape having an adhesive having a peeling strength, the tool comprising:
   a plurality of ejector pins together having a length and width defining a footprint of the ejector pins;
   a support table including an upper surface for supporting the tape and semiconductor die, the support table further including an aperture in the upper surface, the aperture being at least as large as the footprint of the ejector pins, and the aperture having at least one chamfered sidewall; and
   a vacuum source for holding the tape to the support table, the vacuum source being communicated to the aperture and exerting a force on the tape exceeding the peeling strength of the adhesive.

10. The tool recited in claim 9, the aperture being rectangular and including four chamfered sidewalls.

11. The tool recited in claim 9, the aperture being rectangular and including two chamfered sidewalls opposite each other.

12. The tool recited in claim 9, the at least one chamfered sidewall having a sidewall sloped at an angle of between 10° and 60° relative to the upper surface of the support table.

13. The tool recited in claim 9, the at least one chamfered sidewall defining a space into which the tape may be sucked away from at least one edge of the semiconductor die.

14. The tool recited in claim 9, further comprising at least one ejector for extending through the aperture from the lower surface of the support table, the ejector capable of lifting the semiconductor die upward after the first layer has been sucked away from at least one edge of the semiconductor die.

15. The tool recited in claim 9, wherein the aperture is rectangular and sized to have a length and width at the upper surface that is greater than a length and width of the semiconductor die, and wherein the aperture is sized to have a length and width at the lower surface that is less than the length and width of the semiconductor die.

16. The tool recited in claim 15, wherein the tape is sucked away from at least one edge of the semiconductor die and against the at least one chamfered sidewall upon activation of the vacuum source.

17. A tool for separating a semiconductor die from at least one layer of a tape, the tape having an adhesive having a peeling strength, the tool comprising:
   a plurality of ejector pins for lifting the semiconductor die upward;
   a support table including an upper surface for supporting the tape and semiconductor die, the support table further including a rectangular aperture in the upper surface sized to receive all of the plurality of ejector pins therethrough, and the aperture having at least one chamfered sidewall, the aperture sized to have a length and width at the upper surface that is greater than a length and width of the semiconductor die, and wherein the aperture is sized to have a length and width at the lower surface that is less than the length and width of the semiconductor die; and
   a vacuum source for holding the tape to the support table, the vacuum source being communicated to the aperture and exerting a force on the tape exceeding the peeling strength of the adhesive.

18. The tool recited in claim 17, wherein the tape is sucked away from at least one edge of the semiconductor die and against the at least one chamfered sidewall upon activation of the vacuum source.

19. The tool recited in claim 17, wherein the aperture includes four chamfered sidewalls.

20. The tool recited in claim 17, the at least one chamfered sidewall defining a space into which the tape may be sucked away from at least one edge of the semiconductor die.

* * * * *